3,418,282
Patented Dec. 24, 1968

3,418,282

PHOTOSENSITIVE POLYMERS, PREPARATION AND PRODUCT THEREOF

Alberto Guzzi, Ferrania, and Roberto Bosio, Pinerolo, Italy, assignors to Ferrania S.p.A., Milan, Italy No Drawing. Filed Dec. 14, 1965, Ser. No. 513,822
Claims priority, application Italy, Feb. 12, 1965, 2,838/65
8 Claims. (Cl. 260—72)

ABSTRACT OF THE DISCLOSURE

Novel photosensitive polymers containing recurring monomer units of the formula

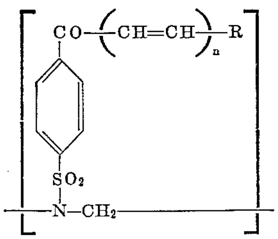

wherein R is a part of a photosensitive chalcone radical and is a substituted or unsubstituted phenyl radical or a furyl radical and $n$ is equal to 1 or 2 are shown, together with a process for their preparation and a product containing said polymers.

This invention relates to novel photosensitive polymers, the process for their preparation and products including such photosensitive polymers.

The photochemical properties of organic compounds containing a chalcone group are known. Such compounds are insolubilized by the action of ultraviolet light and this property makes them useful in the preparation of resist lacquers in the field of graphic arts, e.g. in the preparation of printing masters, silk screen process masters, etc. It is desirable to provide photosensitive polymers which produce images that are more readily developable due to the fact that the photosensitive compound is extremely soluble in a suitable solvent whereas the photoreaction product thereof is quite insoluble in such solvent.

It is an object of this invention to provide an insoluble photosensitive polymer having utility for photomechanical reproductions.

Another object of this invention is to provide a photosensitive polymer which, when used in photomechanical reproduction process masters, operates efficiently with a minimal fog level.

Other objects and advantages will be apparent from the following disclosure.

The photosensitive polymers of this invention contain recurring monomer units of the formula

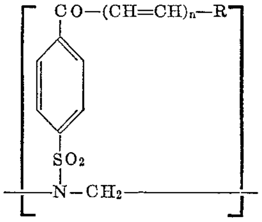

where R represents a substituted or unsubstituted aryl (e.g. phenyl) or heterocyclic (e.g. furyl) radical and $n$ is equal to 1 or 2. It has been found that polymers of the aforementioned structure are very soluble in conventional organic solvents, produce images which upon exposure to ultraviolet light are hard and tough and insoluble in solvents for the original photosensitive polymers, are relatively stable in photomechanical constructions and are relatively inexpensive to prepare.

By appending a sulfonyl chloride group to the para position of acetophenone, using the procedure described by Bellone, Chittolini and Guzzi in "Annali di Chimica," vol. 54, p. 510 et seq. (1964), these photosensitive compounds can be obtained according to the polymer reaction sequence.

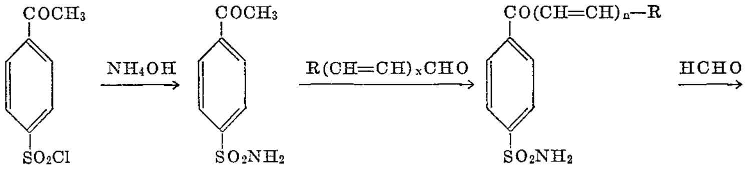

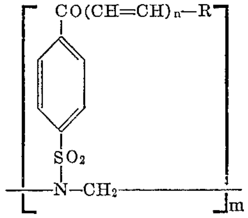

wherein R is as hereinabove defined, X is 0 or 1 and $m$ is an integer greater than 1. The photosensitive polymers provided by the aforementioned reaction sequence have certain advantages as compared to photosensitive polymers prepared from chalcones. For example, French Patent 1,266,456 (Examples 10–13) describes the preparation of photosensitive polymers by the reaction of p-(beta-hydroxy-ethoxy) chalcones with polymeric anhydrides, the structure being identified as Formula I.

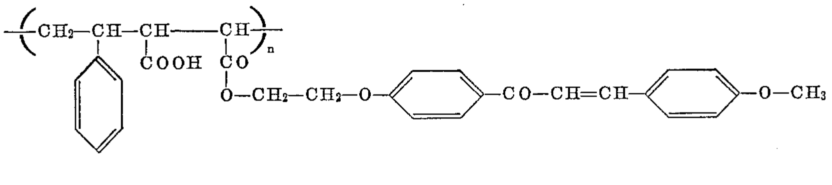

Formula I

When compared with the photosensitive polymers of the French patent, the compounds prepared in Examples 1 and 2 herein (Formulae II and III respectively) to provide lithographic masters which, after exposure to ultraviolet light, can be more readily developed to provide the desired image due to a noticeably greater differential between the solubility of the exposed and unexposed photosensitive polymer in conventional solvents or solvent mixtures. Accordingly, it is easier to select a suitable solvent or solvent mixture in which the photosensitive polymers of this invention are completely soluble and in which the photoreaction product thereof is quite insoluble. This is important in reducing or eliminating undesirable fog on developed aluminum lithographic plates as a result of more complete removal of photosensitive polymer from the unexposed areas of the plate.

The preparation of the photosensitive polymers of this invention utilizes relatively inexpensive materials and is procedurally quite simple. These polymers are more readily recoverable from the reaction mixture and are not of a rubbery nature when wet, in distinct contrast to the compounds of French Patent No. 1,266,456.

The following examples illustrate the preparation of the photosensitive polymers of this invention and are not intended to limit the scope thereof.

Example 1

8 g. of p-acetylbenzene sulfonamide (Annali di Chimica 54, 513 (1964)) were suspended in 50 ml. of ethanol. To this suspension was added a solution containing 16 grams of NaOH in 100 ml. of water was added until the solution was clear. To this solution were added 5.5 g. of anisic aldehyde dissolved in 30 ml. of ethanol. Over a 24 hour period an abudant precipitation of a yellow colored produce occurred. After cooling in an ice bath the precipitate was filtered, washed with a small quantity of alcohol and dried in the air under dark conditions. Yield: 8.5 g. The compound decomposed at 260° C.

34.6 g. of the above described chalcone were admixed with 43.3 ml. of a 40% aqueous formaldehyde solution and subjected to heating in an oil bath at a temperature of 120° C. for 25 minutes. The plastic mass which separated upon cooling of the reaction mixture was recovered and triturated in ethyl alcohol. A pulverulent product melting at 173–175° was obtained, having the formula

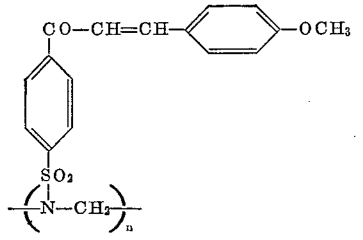

Formula II

A 2% solution of the above polymer in ethylene glycol monomethylether was coated onto a carefully degreased aluminum plate. By drying this coating at 100° C. a photosensitive surface was obtained which, after exposure to a source of ultraviolet radiation through a negative original was first treated with chloroform until the unexposed areas of the coating were entirely dissolved. The plate was then dried and cleaned with 5% phosphoric acid. The resulting developed plate was suitable for use as a master for offset printing, since the image-forming areas were lyophilic and readily retained the oil-based ink, while the non-image-forming areas had a hydrophilic character and repelled the ink. Positive reproductions were obtained by using this master on a conventional printing machine.

Example 2

40 g. of p-acetylbenzene sulfonamide suspended in 250 ml. of warm alcohol were added to a solution containing 8 g. of NaOH in 50 ml. of water. Then 500 ml. of water were added, and the mixture was heated until complete dissolution occurred. The solution thus obtained was cooled to 30–35° C., and 24.4 g. of furyl acrolein dissolved in 80 ml. of alcohol were added. After standing for twelve hours the mixture was cooled in ice water, and the yellow precipitate which formed was recovered by filtration. Yield: 41.5 g. The compound does not melt below 300° C. 30 g. of this compound were admixed in a flask with 37 ml. of 40% formalin. The mixture was heated on asbestos wire gauze until a nearly clear solution was obtained. At this point 8 ml. of glacial acetic acid were added, and the mixture was refluxed for 15 minutes. After cooling at room temperature the reaction mixture was poured into water. The mass which separated was triturated in a mortar first with water and then with ethanol. Yield: 22 g. The resulting product had the formula

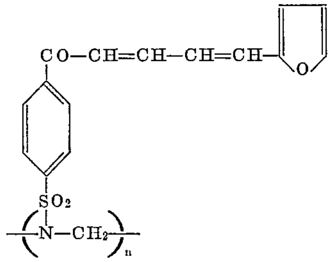

Formula III

From this compound a master was prepared in a manner similar to that described in the Example 1. However, in this case the developer was formed by an ethanol/methyl cellosolve mixture in a ratio of 2:1.

Example 3

From 40 g. of p-acetylbenzene sulfonamide and 26.4 g. of cinnamic aldehyde, using a procedure similar to that described in the Examples 1 and 2, 32.5 g. of the cinnamilidene derivative were obtained. From the latter, by reaction with formalin in the manner descirbed in Example 1, the compound of Formula IV was obtained, from which it was possible to obtain a photosensitive surface developable in ethanol/cellosolve mixture (1:2 ratio).

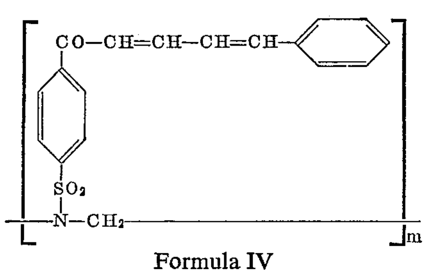

Formula IV

Various other embodiments of the present invention will be apparent to those skilled in the art without departing from the scope thereof.

What is claimed is:

1. A photosensitive polymer consisting essentially of recurring monomer units of the formula

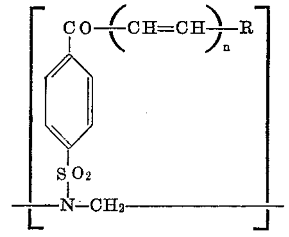

wherein R is a part of a photosensitive chalcone radial and is a substituted or unsubstituteed phenyl radical or a furyl radical and $n$ is either 1 or 2.

2. The photosensitive polymer of claim 1 in which R is a phenyl group.

3. The photosensitive polymer of claim 1 in which R is a furyl group.

4. The photosensitive polymer of claim 1 in which said formula is

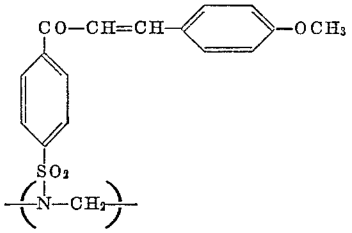

5. The photosensitive polymer of claim 1 in which said formula is

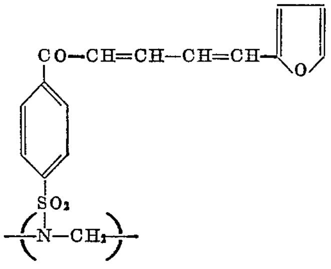

6. The photosensitive polymer of claim 1 in which said formula is

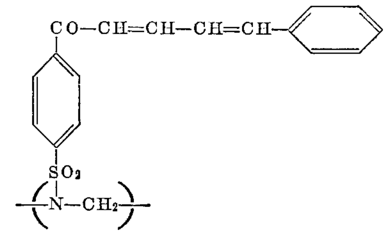

7. A photosensitive element having a layer containing the photsensitive polymer of claim 1.

8. A process for the preparation of the photosensitive polymer of claim 1 consisting essentially of reacting p-acetyl benzene sulfonamide with an aldehyde of the formula $$R\text{-}(CH=CH)_x\text{-}CHO$$

wherein R is a part of a photosensitive chalcone radical and is a substituted or unsubstituted phenyl radical or a furyl radical and x is either 0 or 1, and polymerizing the resulting product with an aqueous solution of formaldehyde.

References Cited

UNITED STATES PATENTS

| | | | |
|---|---|---|---|
| 2,696,435 | 12/1954 | Neugebauer et al. | 96—91 |
| 2,716,102 | 8/1955 | Unruh et al. | 96—115 |
| 2,757,090 | 7/1956 | Neugebauer et al. | 96—115 |
| 2,948,706 | 8/1960 | Schellenberg et al. | 96—115 |

FOREIGN PATENTS

| | | |
|---|---|---|
| 600,254 | 6/1960 | Canada. |

WILLIAM H. SHORT, *Primary Examiner.*

E. M. WOODBERRY, *Assistant Examiner.*

U.S. Cl. X.R.

96—115